United States Patent [19]
Welch

[11] Patent Number: 5,760,449
[45] Date of Patent: Jun. 2, 1998

[54] REGENERATIVE SWITCHING CMOS SYSTEM

[76] Inventor: James D. Welch, 10328 Pinehurst Ave., Omaha, Nebr. 68124

[21] Appl. No.: 578,336

[22] Filed: Dec. 26, 1995

Related U.S. Application Data

[63] Continuation-in-part of Ser. No. 250,906, May 31, 1994, abandoned, and a continuation-in-part of Ser. No. 368,149, Dec. 29, 1994, Pat. No. 5,663,584.

[51] Int. Cl.$^6$ .......................... H01L 29/76; H01L 29/94; H01L 31/062; H01L 27/095
[52] U.S. Cl. .......................... 257/369; 257/383; 257/384; 257/471
[58] Field of Search .................. 257/369, 382, 257/383, 384, 473, 485, 471

[56] References Cited

U.S. PATENT DOCUMENTS

| | | | |
|---|---|---|---|
| 4,300,152 | 11/1981 | Lepselter | 257/376 |
| 4,485,550 | 12/1984 | Koeneke et al. | 438/233 |
| 4,696,093 | 9/1987 | Welch | 438/571 |
| 5,049,953 | 9/1991 | Mihara et al. | 257/409 |
| 5,177,568 | 1/1993 | Homna et al. | 257/295 |
| 5,229,323 | 7/1993 | Shimada et al. | 438/522 |

OTHER PUBLICATIONS

Etched Schottky Barrier MOSFETS Using A Single Mask, Hogeboom & Cobbold, Electroniccs Letters, vol. 17, No. 5/6 Mar. 1971.

SB-IGFET: An Insulated-Gate Field Effect Transistor Using Schottky Barrier Contacts for Source & Drain, Lepselter & Sze, Proc IEEE, Aug. 1968.

Some Properties of Chromium-Doped Silicon, Lebedev & Sultanov, Soviet Physics, vol. 4, No. 11, May 1971.

Compound Formation Between Amorphous Silicon & Chromium, Yacobi et al. J. App. Phy 51(12) Dec. 1980.

Metallurgical & Electrical Properties of Chromium Silicon Interfaces, Martinez et al., Solid State Physics, vol. 23.

Formation Kenetics of $CrSi_2$ Films on Si Substrates With & Without Interposed $Pd_2Si$ Layer, Olowolafe, J. App. Phys. vol. 47, No. 12, 1976.

The Metal-Semiconductor Contact: An Old Device with a New Future, Yu, IEEE Spectrum, Mar. 1970.

*Primary Examiner*—Steven H. Loke
*Attorney, Agent, or Firm*—James D. Welch

[57] ABSTRACT

Complementary Metal Oxide Semiconductor (CMOS) Schottky barrier Field Effect Transistor systems, which are a seriesed combination of N and P-Channel MOSFETS, in which Source Schottky barrier junctions of the N and P-Channel Schottky barrier MOSFETS are electically interconnected, (rather than the Drains as in conventional diffused junction CMOS), which Schottky barrier MOSFET system demonstrates Regenerative Inverting Switching Characteristics in use are disclosed. Both the N and P-Channel Schottky barrier MOSFET devices are unique in that they provide operational Drain Current vs. Drain to Source voltage as a function of Gate voltage only where the polarities of the Drain voltage and Gate voltage are opposite, referenced to the Source as a common terminal, and where the polarity of the voltage applied to the Gate is appropriate to cause Channel inversion. Experimentally derived results which demonstrate and verify the operation of N and P-Channel Schottky barrier MOSFETS actually fabricated on P and N-type Silicon respectively, by a common procedure using vacuum deposited Chromium as a Schottky barrier forming metal, are also provided.

8 Claims, 4 Drawing Sheets

REGENERATIVE SWITCHING CMOS SYSTEM

This application is a continuation-in-part of application Ser. No. 08/250,906, filed May 31, 1994, now abandoned, and a continuation-in-part of application Ser. No. 08/368, 149, filed Dec. 29, 1994, now U.S. Pat. No. 5,663,584. +gi The invention in this Application was developed in part under support provided by a grant from the Energy Related Inventions Program of the United States Federal Department of Energy, under Contract No. DE-FG47-93R701314. The United States Government has certain rights in this invention.

TECHNICAL FIELD

The present invention relates to semiconductor devices and systems and suggests a procedure for fabrication thereof. More particularly the present invention is a MOSFET, and systems of MOSFETS, which MOSFETS operate only when opposite Polarity Voltages are Applied from the Drain to the Source and from the Gate to the Source thereof, and the Polarity of Voltage applied to the Gate is appropriate to Invert a Channel Region thereof. The preferred embodiment utilizes Schottky barrier Drain and Source rectifying junctions. Both N and P-Channel MOSFET devices, preferably simultaneously formed in a single substrate, are combined to form Complementary Metal Oxide Semiconductor Field Effect Transistor (CMOS) systems in which the Sources of N and P-Channel MOSFETS, rather than Drains as in conventional CMOS systems, are electrically interconnected. Present invention CMOS systems exhibit Regenerative Switching characteristics in use.

BACKGROUND

The use of N and P-Channel Metal Oxide Semiconductor Field Effect Transistors, (hereinafter MOSFETS), in functional combination to form Complementary Metal Oxide Semiconductor, (hereinafter CMOS), field effect transistor device systems is well known, as are the benefits associated with the use thereof. Said benefits include enabling realization of very low power consumption digital switching logic circuitry such as is found in electronic wrist watches which run for years on one small battery.

Briefly, a conventional MOSFET is comprised of N or P-type semiconductor substrate in which are formed regions of oppositely doped material, separated by a distance therebetween. The regions of oppositely doped material are termed the "Source" and "Drain" and the distance therebetween is termed the "Channel Region". Diffused rectifying junctions are conventionally formed at the ends of the channel region, both at the source and at the drain. Continuing, atop the channel region surface is present an insulating material, such as silicon dioxide, atop of which insulating material is present a "gate" which is made from an electrically conductive material. Application of a voltage from the Drain-to-Source of a proper polarity, simultaneous with the application of a Gate-to-Source voltage of a proper polarity causes the channel region to "invert" and become of a doping type similar to that in the source and drain regions, thereby providing a conductive pathway between said drain and source. That is, application of a gate-to-source voltage modulates the conductivity of, hence flow of current between, the drain and source. Because the resistivity of the insulating material is high, very little gate current is required to effect modulation of said drain to source current flow. As mentioned above, CMOS device systems comprise a series

2 of electrically connected N and P-channel MOSFET devices, formed on P and N-Type semiconductor respectively. To form CMOS the drain of an N-Channel MOSFET device is electrically connected to the drain of the a P-channel MOSFET device and the source of the P-channel device is connected to a positive voltage (Vd), while the source of the N-channel MOSFET device is connected to a lower voltage (Vs), typically ground. In use, a relatively low, (approximately the voltage applied to the source of the N-channel MOSFET device), gate voltage applied simultaneously to the gates of said electrically connected devices modulates the P channel device so that it conducts, while having no channel conductivity increasing effect on the N channel device. Similar simultaneous application of a relatively high, (with respect to the voltage applied to the source of the N-channel MOSFET device, e.g. approximately Vd), gate voltage affects the N and P channel devices in an opposite manner. That is the N-channel device channel conductivity is effectively increased while the P-channel device channel conductivity is not increased. The result being that varying gate-to-source voltage from relatively low to relatively high causes the voltage present at the electrically connected N and P-channel device drains to vary between that applied to the source of the and P-channel device, (Vd), and that applied to the source of the N-channel device, (typically, but not necessarily, ground potential), respectively. As mentioned above, CMOS switching is effected with very little gate current flow, as the insulating material between the gate and the semiconductor is of a very high resistance, (e.g. ten-to-the-forteenth ohms). As well, drain to source current flows only briefly at the switching point when both devices are momentarily conducting. This is because current cannot flow through an electrically connected series of MOSFETS when either thereof does not have a conducting inverted channel present. Conventional MOSFET and CMOS operational characteristics are described in numerous circuit design texts such as "Basic Integrated Circuit Engineering" by Hamilton and Howard, McGraw-Hill, 1975.

While conventional CMOS device systems provide benefits, fabrication thereof is by diffused junction technology which requires many steps, including many photoresist procedures, sequential mask alignments, and various etches. It is to be appreciated that each step involves an efficiency factor, and thereby introduces defects leading to decreased yield of working devices on a fabrication substrate. In some instances the ratio of working to the total devices attempted on a substrate can be fifty (50%) percent or even less. For instance if a procedure step carries a ninety (90%) percent efficiency factor, (an extremely low value used for demonstrative purposes), after two such steps only eighty-one (81%), percent of the devices will be operational. After six (6) such steps, it should be appreciated, the effective yield of working devices will be less than fifty (50%) percent. Obviously, if the number of steps in a fabrication procedure can be reduced the yield of working devices can be increased. However, conventional diffused junction technology does not allow reducing the number of steps involved in a fabrication procedure below a relatively large number.

A fabrication procedure which requires a reduced number of fabrication procedure steps to provide functionally equivalent CMOS device systems would therefore be of utility.

With that in mind it is to be appreciated that an alternative to conventional diffused junction technology is that of Schottky barrier junction technology. The present invention utilizes said Schottky barrier junction technology in a fabrication procedure requiring a relatively few number of steps to provide CMOS device systems. Another benefit of utilizing Schottky barrier technology is that rectifying junctions formed therefrom are "Hot-Carrier" devices. That is majority carriers, rather than minority carriers form the basis of operation. It is well known that Hot Carrier devices react, (ie. switch), faster than do, for instance Diffused Junction based devices. This is because minority carriers need not be withdrawn from a depletion region in a rectifying junction for instance, to proceed from a conducting forward biased state to a nonconducting reverse biased state. Devices formed from Schottky barrier technology therefore can provide inherently faster operation. This point is well documented in an article by Yu, titled "The Metal-Semiconductor Contact: an Old Device with a New Future", IEEE Spectrum, Vol. 7, No. 3, March 1970. As well, it is well known that circuits which utilize "Regenerative switching" provide inherently faster operation. A CMOS system which provides Regenerative Switching and which is fabricated from Hot Carrier Schottky barriers at the Source and Drains of the N and P-Channel MOSFETS which comprise said CMOS System, would therefore provide great utility. No known reference reports, or remotely hints that such a Regeneratively switching CMOS inverter system can be realized, emphasis added. To the Inventor's knowledge, only the present Disclosure teaches N and P-Channel MOSFETS which operate as do those of the present invention.

A Search of relevant references has provided an article by Hogeboom and Cobbold, titled "Etched Schottky Barrier MOSFETS Using A Single Mask". Said article describes the fabrication of a P-Channel MOSFET on N-type silicon with aluminum forming the rectifying junction Schottky barrier source and drain junctions. (Note that aluminum does not form a rectifying junction Schottky barrier on P-type silicon hence is not an appropriate metal for use in realization of N-channel Schottky barrier MOSFETS). Said article also describes both N and P-Channel conventional diffused junction MOSFETS fabricated using a single mask, but which required a diffusion of a dopant, hence, did not operate based upon Schottky barrier junction presence. Aluminum present provided ohmic contact to diffused regions as in conventional MOSFETS. This paper also suggests the use of vanadium to form source and drain regions. It is also noted that this paper describes use of a silicon dioxide undercutting etch which facilitates self delineation of fabricated devices. (The silicon etchant taught is a mixture of fifty (50) parts acetic acid, thirty (30) parts nitric acid, twenty (20) parts hydrofluoric acid and one (1) part aniline). A patent to Welch, U.S. Pat. No. 4,696,093 describes a procedure for fabricating Schottky barrier MOSFETS, including an approach requiring only one-mask and one-etch and the use of chromium, (which after application to silicon is subjected to an annealing procedure to form chromium disilicide), as the metal used to form rectifying source and drain Schottky barrier junctions. A Masters Thesis presented by James D. Welch at the University of Toronto in 1974 titled "Design and Fabrication of Sub-Micron Channel MOS Transistors by Double Ion-Implantation" mentions Schottky barrier rectifying junctions discoverved to exist after a thirty (30) minute, six-hundred-fifty (650) degree centigrade anneal of chromium present on the back, unpolished, side of an N-type silicon substrate. The reverse breakdown voltage of said rectifying junctions was found to be upwards of eighty (80) volts. However, said thesis work did not include investigation of annealing deposited chromium on P-type silicon. A paper by Lebedev and Sultanov, in Soviet Physics Semiconductors, Vol. 4, No. 11, May 1971, pages 1900–1902 teaches the chromium diffused into P-type Silicon at high, (e.g. twelve hundred (1200) degrees centigrade), for long periods of time, (e.g. twenty (20) to fifty (50) hours), dopes said P-type silicon N-type. Nothing, however, is stated regarding the properties of chromium disilicide formed by annealing a thin film of chromium which has been deposited upon said P-type silicon silicon at lower temperatures. A paper by Olowolafe et al., J. App. Physics, Vol 47, No. 12, December 1976, describes investigation of the formation of Chromium Disilicide by annealing deposited chromium to silicon. A patent to Kieneke et al. U.S. Pat. No. 4,485,550 describes a Schottky barrier MOSFET fabricated using Platinum as the Schottky barrier forming metal in Source and Drains regions thereof. Said patent reports that the Schottky barrier MOSFETS reported can one for one replaced diffused junction MOSFETS in a CMOS system to provide a Latch-up proof result. A paper by Lepselter and Sze, titled "SB-IGFET: An Insulated-Gate Field Effect Transistor Using Schottky Barrier Contacts for Source and Drain", in the Proceedings of the IEEE, August 1968, pages 1400 through 1402 describes a similar P-Channel Schottky barrier insulated gate field effect transistor, (ie. IGFET), fabricated using Schottky barrier contacts for source and drain. Said IGFET again utilized platinum silicide in the formation of the source and drain junctions. It is stated that during operation the source junction of the device is reverse biased in the inverted channel region and that reverse leakage or tunneling current therethrough is what applied gate voltage modulates. The Lepselter et al. article however, makes no mention of the use of Schottky barriers to form N-Channel devices on P-type silicon, and reports operational characteristics are achieved therefrom which are consistent with diffused junction MOSFETS. In fact, owing to the rather large reverse barrier height difference between platinum silicide and N-type silicon, (ie. 0.85 ev), and between platinum silicide and P-type silicon, (ie. 0.25 ev), it is unlikely that N-channel devices would be operable, or even if they were, that an effective CMOS device system could be achieved using platinum-silicide to form both N and P-channel devices. This is because the MOSFET devices in a CMOS device system must have essentially symetrical and Complementary operational characteristics to provide efficient switching capability. However, as disclosed in the Detailed Description Section of this Disclosure, platinum might be very well suited for forming a single device equivalent to CMOS on N-type silicon.

No known published reference states that a CMOS device system which provides regenerative switching characteristics should be fabricated wherein Schottky barriers serve as source and drain rectifying junctions in both N and P-Channel MOSFETS in either separate semiconductor substrates, or preferably on a single semiconductor substrate, where said N and P-Channel MOSFETS provide Operational Drain Schottky barrier junction Current vs. Applied Drain Schottky barrier to Source Schottky barrier junction Voltage, as a function of Applied Gate Voltage, both said Applied Voltages being referenced to said Source Schottky barrier junction as a common terminal, only wherein said Applied Drain Schottky barrier junction to Source Schottky barrier junction Voltage, and Applied Gate Voltage are of opposite polarity. In addition no known reference documents that the a single fabrication procedure utilizing both N and P-type semiconductor can simultaneously efficiently form sufficiently balanced Schottky barrier rectifying junctions on both said N and P-type semiconductor, preferably in a single semi conductor substrate, thereby allowing essentially balanced Complementary N and P-channel MOSFETS to be easily achieved, particularly on a single substrate, by a common simultaneous fabrication procedure. In addition, as mentioned above, no known reference even remotely hints that a CMOS system can be fabricated which demonstrates regenerative switching characteristics in use. This is a very significant point as without some insight as to the fact that such a regenerative switching CMOS system can be achieved, it would not be obvious to one skilled in the art to even attempt to fabricate such a regeneratively switching CMOS System, or what elements, (e.g. metal, metal-silicide and semiconductor), might be utilized etc. in an attempt to do such. The present invention provides missing teachings along with documented experimental results supporting said teachings.

While the above shows that it is known to form MOS-FETS using Schottky barriers at Source and Drain, and that the use of Chromium in the formation of Schottky barrier junctions is known, no known reference remotely hints that the use of Chromium at Source and Drain in the fabrication of Schottky barrier MOSFETS should provide Schottky barrier MOSFETS which operate as do present invention Schottky barrier MOSFETS. Further, no known reference suggests that a CMOS System can be achieved in which the Sources are electrically interconnected, (rather than Drains as in conventional Diffused Junction and reported Schottky barrier MOSFETS), which CMOS System demonstrates Regenerative Hot Carrier Based, (hence, speed enhanced), Switching in use, emphasis added.

Two patents to Proebsting, U.S. Pat. Nos. 4,985,643 and 5,343,090 are also identified as they serve to document that speed enhancement in CMOS circuits is desirable. Said invention utilizes feedback between stages in a circuit to allow use of substantially all of a signal to turn on devices, rather than require that a portion thereof be utilized to turn devices off.

It is mentioned that in a proprietary report, dated Jan. 10, 1991, which was prepared by the National Institute of Standards and Technology, (NIST) in support of the grant which has funded the work disclosed herein, it was concluded that the present invention could have an impact on energy conservation and utilization and that if the projected performance of the invention can be achieved, then commercial success seems assured. Said proprietory NIST report was provided in response to a confidential application for grant funds submitted to the funding agency years earlier by the inventor herein, in search of support to allow actual present invention reduction to practice.

Finally, it is emphasised that teachings obviating the present invention are found only in this Disclosure, emphasis added. Without the present Disclosure a researcher would not find any suggestion that a CMOS System with Regenerative Hot Carrier Based Switching Characteristics should be realizable.

The present invention teaches an experimentally verified MOSFET system and a recommended fabrication procedure therefore.

DISCLOSURE OF THE INVENTION

The present invention comprises MOSFET devices and systems thereof which operate differently than any previously reported MOSFETS known to the Inventor. Present invention MOSFETS are distinguished over the known prior art in that they provide significant Drain Current vs. applied Drain to Source Voltage, as a function of Applied Gate to Source Voltage, only when the applied Drain and Gate Voltages, each with respect to the Source, are of the opposite Polarities, and when the Applied Gate Voltage is of a Polarity appropriate to Invert a MOSFET Channel Region. All known reported MOSFETS provide Drain vs. Applied Drain to Source Voltage when the same Polarity Voltage is applied to both the Drain junction and Gate, with respect to a Source junction.

Before disclosing the MOSFET Devices and Systems of the present invention, some insight to their fabrication is provided directly. In a preferred embodiment, the present invention is a Complementary Metal Oxide Semi conductor (CMOS) System which assumes the presence of a silicon substrate in which are present alternating N and P-type doped regions in a checkerboard pattern, similar to that required for fabrication of conventional CMOS device systems fabricated using diffused rectifying junction technology. Atop said silicon substrate there is caused to be present an insulating material, such as, but not limited to, thermally grown or deposited silicon dioxide and/or silicon nitride etc., into which insulating material are caused to be formed patterns above both said N and P-type regions. Said patterns typically consist of two openings each, each of which openings is delineated by remaining insulating material, said insulating material between two associated openings being a gate insulating material above a channel region, said channel region being wholly present in either an N or P-type regions. Said openings, at a minimum, provide access to the upper sur face of the silicon under said insulating material, and alternatively can comprise an etching into said silicon so that silicon walls are formed at the edges if said openings under the insulating material. In addition, an undercutting of said insulating material can be effected to aid in achieving self aligned devices. Atop said insulating material and atop said silicon in the openings of said patterns there is caused to be present a metal and/or a metal-silicide, (typically by vacuum evaporation or sputtering techniques), which when processed, (typically by an elevated temperature anneal), causes said metal and/or metal-silicide in contact with said silicon, (whether N or P-type), to form Schottky barrier junctions with said N and P-type silicon simultaneously. It is noted that deposition of a metal-silicide might be more appropriate when very small dimension devices are fabricated. This is because formation of disilicide from a metal deposited upon a semiconductor can involve significant, (e.g. hundreds to thousands of angstroms), migration of metal atoms into the semiconductor. If a preformed metal-silicide is deposited onto a semiconductor, this effect might be greatly reduced because a lower temperature and/or shorter anneal time, for instance, can serve to form rectifying junctions between said deposited metal silicide and semiconductor.

While not limiting, a workable single mask/single etch fabrication procedure for realizing the above described CMOS device system is as follows:

1. Provide a silicon substrate, (typically, but not necessarily, of (100) crystal orientation), with alternating N and P-type regions, (each typically doped ten-to-the-fifteenth per-centimeter-cubed), present therein.

2. Grow silicon dioxide atop said substrate to a depth suitable for use as a gate oxide in a MOSFET, (typically but not necessarily six-hundred (600) to three (300) thousand angstroms).

3. Apply photoresist to the surface of said silicon dioxide.

4. Expose said photoresist through a mask which causes two openings to be effected therein over each N and P-type region, each of which openings is surrounded by silicon dioxide, with the silicon dioxide between each two associated openings being a gate oxide above a channel region.

5. Etch the silicon dioxide, preferably anisotropically, to the surface of the silicon and continue to isotropically etch into said silicon to a depth of hundreds of angstroms to one (1) micron or more. (Note that an isotropic silicon etch will undercut the silicon dioxide laterally a length approximately equal to the depth to which said silicon is etched perpendicular to the surface of the silicon substrate. This helps effect discontinuous metal or metal-silicide deposition in step 7).

6. Remove said photoresist, preferably by an asher system in which plasma activated oxygen molecules effectively burn said photoresist away.

7. Deposit metal and/or metal-silicide so that it is present atop the silicon dioxide and atop the resulting open surface of said silicon, in a discontinuous, device self-delineating, manner. An experimentally derived worktable depth in the case where chromium is utilized is eight-hundred (800) angstroms wherein, a step 6 isotropic silicon etch depth of six hundred (600) angstroms to one (1) micron or more is utilized. However, it is noted that said examples are not to be considered limiting of the invention and that thinner layers of chromium, for instance, can certainly be successfully utilized.

8. Process, (typically but not necessarily by an elevated temperature anneal), the resulting substrate so that rectifying Schottky barrier junctions are simultaneously formed between said metal or metal-silicide and said silicon with which said metal or metal-silicide is in contact, in both N and P-type silicon regions. It has been found experimentally that a four-hundred (400) degree centigrade, thirty (30) minute vacuum anneal works well. Again, said example is not to be considered limiting of the invention.

It is mentioned that it has been found that depositing a layer of Gate forming Aluminum atop the silicon dioxide prior to per forming the Schottky barrier forming metal deposition in step 3, and adding a Schottky barrier forming metal etch after step 8, fascillitates the above recited procedure.

It should be appreciated that the recited procedure will, in a relatively few fabrication procedure steps result in self-delineated N and P-Channel MOSFETS being simultaneously formed on the processed silicon substrate in P and N-type silicon regions respectively. To then form CMOS it is only necessary to electrically connect the Source of a device formed in one type, (e.g. N or P-type), of silicon to the Source (if a device formed in the other type, (e.g. P or N-type), silicon. The Drains of each such resulting pair of MOSFET devices can then be connected to appropriate external source(s) of electrical voltage, and gate-to-source voltages applied to the metal and/or metal silicide atop the silicon dioxide in the channel regions to control the voltage present at said electrically connected drains.

As a variation on the above recited procedure one can, in step 5 thereof, cause an opening in an N-type region and an opening in a P-type region to be merged into a single opening, thereby effecting natural connection of the source of one device with the drain another. The remaining openings from each pair of openings will then serve as the drains for connection to external source(s) of electrical voltage. The difference in the presently described embodiment is that the electrical connection of the source regions of N and P-Channel devices straddles the junction between associated N and P-type regions in contact with said silicon in said N and P-type regions, rather than by a means which provides insulation from the silicon substrate at said electrical connection point.

An etch and metal deposition as described in the article by Hogeboom and Cobbold cited in the Background Section, but in which the silicon substrate contains both N and P-type regions, and in which the metal deposited is chromium, followed by an anneal at four hundred (400) degrees centigrade for thirty (30) minutes to simultaneously form Schottky barrier junctions in both N and P-type silicon regions, can provide simultaneous formation of operable N and P-Channel MOSFET devices which can be electrically connected to, provide CMOS device systems. While Hogeboom and Cobbold describe use of a wet acid etch to provide an isotropic silicon etch to undercut the silicon dioxide, a more controllable, (the etchant taught in the Hogeboom and Cobbold article has been found to etch silicon at approximately three-thousand 3000 angstroms a second), and hence, perhaps preferable approach involves use of dry plasma anisotropic etching of silicon dioxide using CF4 gas, (perhaps with a bit of hydrogen added thereto), at low pressure, (e.g. a militorr) and relatively high plasma energy, to provide silicon dioxide walls at the edges of the etched patterns which are essentially perpendicular to the silicon surface, followed by an elevated pressure, (e.g. hundreds of militorr), reduced plasma power isotropic plasma etching of the silicon using CF4 gas with added oxygen (e.g. five (5%) percent), to provide a an etched silicon which undercuts the silicon dioxide. As mentioned, undercutting said silicon dioxide aids achieving discontinuous metal or metal-silicide deposition.

Metals and/or metal-silicides other than chromium and chromium-disilicide might also be utilized, but to date only chromium has been shown to produce MOSFETS with operating characteristics as reported in this Disclosure. Also, care must be exercised to assure that a selected metal and/or metal-silicide does not adversely interact with a present insulating material. For instance, vanadium, titanium, niobium, and zirconium adversely react with silicon dioxide whereas chromium, molybdenum and tungsten do not. Another complication can result where a process formed silicide or oxide is reactive with silicon dioxide. As well, Schottky barriers of similar barrier heights on N and P-type silicon are desirable and the Schottky barriers should be formed on N and P-type silicon simultaneously whether metal and/or metal-silicide is provided during a reasonable process, such as an elevated temperature anneal in the range of four-hundred, (400), degrees centigrade or less. Many metal-silicon reactions provide numerous phases, (e.g. titanium, iron, cobalt, nickel, rubidium, lead, hafnium, iridium, and platinum), whereas vanadium, chromium, zirconium, niobium, molybdenum, tantalum and tungsten form only a single disilicide phase with silicon. As thin film silicide formation driving forces are not well understood at the present time, a single phase formation is desirable as it reduces complications during a fabrication procedure. As well, too large a Schottky barrier height on either N or P-type semiconductor can lead to inoperable resulting MOSFET devices therein Chromium-disilicide provides a documented Schottky barrier height on N-type silicon of 0.57 ev with an apparently essentially balanced similar barrier height on P-type silicon. Platinum silicide provides 0.75 ev on N-type silicon, Diplatinum silicide, 0.7 ev and Platinum silicide 0.88 ev, again on N-type silicon. Elements which form silicides with Schottky barrier heights on N-type silicon similar to that of chromium are molybdenum with molybdenum disilicide providing 0.55 ev, tantalum with tantalum disilicide providing 0.59 ev, titanium with titanium disilicide providing 0.61 ev and zirconium with zirconium disilicide providing 0.55 ev. Cobalt silicide and cobalt disilicide each provide 0.65 ev. Eridium disilicide and gadnium disilicide each provide 0.38 ev. Rhubideum silicide provides 0.69 ev and tungsten disilicide provides 0.65 ev.

It is also to be noted that transition metal-silicide formation is generally uniform, but that yittrium, rhubideum, paladium iridium and hafnium do not provide uniform silicide layers. It is believed that silicide formation is nucleation controlled and that this leads to interfacial nonuniformities which are more severe than for non-nucleation controlled transition metal silicide formation (that is for diffusion or reaction controlled metal silicide formation).

In view of the above, and in view of the fact that molybdenum is known to have a temperature expansion coefficient similar to that of silicon, molybdenum, as well as chromium, might be a particularly suitable metal for use in realizing the present invention, if its use leads to MOSFETS which operate only when opposite polarity voltages are applied to Gate and Drain.

Other considerations involve compatibility of a Schottky barrier metal or metal-silicide with aluminum, which is typically used as interconnecting trace metal in integrated circuits. For instance it has been reported that when aluminum in contact with platinum or paladium is annealed at two-hundred-twenty-five (225) and two-hundred-fifty (250) degrees centigrade respectively, voids and thickenings are observed. Said effect is reported to be less pronounced when tantalum, chromium, molybdenum and cobalt are used. (See Colgan, "Aluminum-Transition Metal Thin Film Reactions", Ph.D. thesis, Cornell, 1987 and J. Appl. Phys., 62(4), 1224, 1987). It is noted that the information provided above regarding silicides was gleened primarily from the book titled "Electronic Materials Science", by Mayer &. Lau, MacMillan Publishing, 1990.

It is also noted that, regardless of fabrication steps or materials utilized, in addition to regeneratively switching CMOS, the sources of two present invention MOSFET devices formed on similar P-type (N-type) semiconductor can be electrically connected to one another to form Balanced Differential MOSFET Pair systems. As described in the Detailed Description Section, the present invention also enables fabrication of single device equivalents to CMOS wherein Channel Region voltage is monitored during a Channel Region Inversion. Such devices are to be considered within the scope of the present invention.

With the above as insight as to how the present invention systems can be realized, attention its now turned to the aspects of the present invention which are considered to be new, novel and non-obvious. Schottky barrier MOSFETS fabricated using Chromium as the Drain and Source Junction Schottky barrier forming metal have been fabricated and provide examples of MOSFETS which provide Drain Junction Current vs. Applied Drain to Source Junction Voltage, only when the Applied Drain to Source Junction Voltage is if the opposite Polarity as that Applied between the Gate and Source, and the Polarity of the Applied Gate Voltage is appropriate to invert the Channel Region. That this is the case will be better appreciated by reference to the Detailed Description Section in conjunction with the Drawings of this Disclosure which show Operational Curves of fabricated MOSFET Devices. To the Inventor's knowledge, MOSFETS with such Operating Characteristics have never been reported in the literature.

In particular the present invention, in one aspect of the preferred embodiment is a P-Channel Schottky barrier Metal Oxide Semiconductor Field Effect Transistor (MOSFET) device formed in the surface region of an N-type Semiconductor. Said Schottky barrier MOSFET comprises two Schottky barrier junctions, termed Source and Drain Schottky barrier junctions, which Source and Drain Schottky barrier Junctions are separated by an N-type Semiconductor Channel Region. A Gate is offset from said N-type Semiconductor Channel Region by an insulator material and said P-Channel Schottky barrier MOSFET provides Drain Schottky barrier junction Current vs. Applied Drain Schottky barrier junction to Source Schottky barrier junction Voltage as a function of Applied Gate Voltage Operating Curves only when the Voltage applied to the Drain Schottky barrier junction is of a Positive Polarity, and when the Voltage applied to the Gate is of a Negative Polarity so as to induce an inverted P-type Channel Region, both said Applied Drain Schottky barrier junction and Gate Voltages being referenced to the Source Schottky barrier junction as a common terminal. Said P-Channel Schottky Metal Oxide Semiconductor Field Effect Transistor MOSFET being realized where the Semiconductor is Silicon and the Source and Drain Schottky barrier Junctions are formed between said Silicon and at least one member of the group consisting of Chromium and Chromium Disilicide.

In an equally important aspect of the preferred embodiment the present invention, an N-Channel Schottky barrier Metal Oxide Semiconductor Field Effect Transistor (MOSFET) device formed in the surface region of an P-type Semiconductor. Said Schottky barrier MOSFET comprises two Schottky barrier junctions, termed Source and Drain Schottky barrier junctions, which Source and Drain Schottky barrier Junctions are separated by a P-type Semiconductor Channel region. A Gate is offset from said P-type Semiconductor Channel Region by an insulator material and said N-Channel Schottky barrier MOSFET provides Drain Schottky barrier junction Current vs. Applied Drain Schottky barrier junction to Source Schottky barrier junction Voltage as a function of Applied Gate Voltage Operating Curves only when the Voltage applied to the Drain Schottky barrier junction is of a Negative Polarity, and when the Voltage applied to the Gate is of a Positive Polarity so as to induce an inverted N-type Channel Region, both said Applied Drain Schottky barrier junction and Gate Voltages being referenced to the Source Schottky barrier junction as a common terminal. Said N-Channel Schottky barrier Metal Oxide Semiconductor Field Effect Transistor MOSFET being realized where the Semiconductor is Silicon and the Source and Drain Schottky barrier Junctions are formed between said Silicon and at least one member of the group consisting of Chromium and Chromium Disilicide.

It is to be noted that both the N and P-Channel Schottky barrier Metal Oxide Semiconductor Field Effect Transistor MOSFET devices described can be formed in the surface region of a Semiconductor, in which Source and Drain Schottky barrier junctions are formed in regions of said Semiconductor which have been etched.

Combining the above described P and N-Channel MOSFETS by electrically interconnecting the Gates to one another, and electrically interconnecting the Source Schottky barrier junctions to one another, results in a Complementary Metal Oxide Semiconductor (CMOS) System which demonstrates regenerative switching in use. Said CMOS system comprises a series combination of an N-Channel Schottky barrier Metal Oxide Semiconductor Field Effect Transistor (MOSFET) and a P-Channel Schottky barrier MOSFET, the Source Schottky barrier junction of said N-Channel Schottky barrier MOSFET and the Source Schottky barrier junction of said P-Channel Schottky barrier MOSFET being electrically interconnected to one another.

Gates of said N and P-Channel Schottky Barrier MOSFETS are also electrically interconnected to one another. The P-Channel Schottky barrier MOSFET comprises a device formed in the surface region of an N-type Semiconductor, said P-Channel MOSFET comprising two Schottky barrier junctions, termed Source and Drain Schottky barrier junctions, which Source and Drain Schottky barrier Junctions are separated by an N-type Semiconductor Channel region. A Gate is offset from said N-type Semiconductor Channel Region by a first region of insulator material, and during use Drain Schottky barrier junction Current vs. Applied Drain Schottky barrier junction to Source Schottky barrier junction Voltage as a function of Applied Gate Voltage Operating Curves appear only when the Voltage applied to the Drain Schottky barrier junction is of a Positive Polarity, and when the Voltage applied to the Gate is of a Negative Polarity so as to induce an inverted P-type Channel Region, both said Drain Schottky barrier junction and Gate Voltages being referenced to the Source Schottky barrier junction as a common terminal. The N-Channel Schottky barrier MOSFET comprises a device formed in the surface region of a P-type Semiconductor, said N-Channel MOSFET comprising two Schottky barrier junctions, termed Source and Drain Schottky barrier junctions, which Source and Drain Schottky barrier junctions are separated by a P-type Semiconductor Channel region. A Gate is offset from said P-type Semiconductor Channel Region by a second region of insulator material, and during use Drain Schottky barrier junction Current vs. Applied Drain Schottky barrier junction to Source Schottky barrier junction Voltage as a function of Applied Gate Voltage Operating Curves appear only when the Voltage applied to the Drain Schottky barrier junction is of a Negative Polarity, and when the Voltage applied to the Gate is of a Positive Polarity so as to induce an inverted N-type Channel Region, both said Applied Drain Schottky barrier junction and Gate Voltages being referenced to the Source Schottky barrier Junction as a common terminal. When a Positive Polarity Voltage is applied to the electrically noninterconnected Drain Schottky barrier junction of the P-Channel Schottky barrier MOSFET, said Positive Polarity being with respect to the Voltage applied to the electrically noninterconnected Drain Schottky barrier junction of the N-Channel Schottky barrier MOSFET, and the Voltage at the electrically interconnected Gates is set to essentially that applied to the electrically noninterconnected Drain Schottky barrier junction of the N-channel Schottky barrier MOSFET, the voltage at the electrically interconnected Source Schottky barrier junctions of the N and P-Channel Schottky barrier MOSFETS regeneratively switches, (ie. inverts), to essentially that applied to the electrically noninterconnected Drain Schottky barrier junction of the P-Channel Schottky barrier MOSFET. When the Voltage at the electrically interconnected Gates is set to essentially that applied to the electrically noninterconnected Drain Schottky barrier junction of the P-Channel Schottky barrier MOSFET, the voltage at the electrically interconnected Source Schottky barrier junctions regeneratively switches, (ie. inverts), to essentially that applied to the electrically no-noninterconnected Drain Schottky barrier junction of the N-Channel Schottky barrier MOSFET. Said CMOS system can be realized where the Semiconductor is Silicon and the Source and Drain Schottky barrier Junctions of both the N and P-Channel MOSFETS are formed between said Silicon and at least one member of the group consisting of Chromium and Chromium Disilicide. It is to be noted that in such a Complementary Metal Oxide Semiconductor CMOS System, both the N and P-Channel MOSFETS can be simultaneously formed on a single Semiconductor substrate in which are present alternating regions of P and N-type doping present, by a common fabrication procedure.

It is noted that to form a CMOS system as described above, it is the effective Sources of the N and P-Channel Devices which are electrically interconnected and such an interconnection leads to Regenerative Switching in use. In conventional Diffused Junction CMOS systems, it is not the Sources, but the Drains of N and P-Channel devices which are interconnected, emphasis added. The Sources must be interconnected in the present invention to effect the opposite polarity on each of the electrically interconnected MOSFET Drains and Gates, with respect to the Source of each said device, when switching, (ie. the voltage at the electrically interconnected Schottky barrier junctions regeneratively inverts), Occurs. That this is the case is rather easy to visualize. For instance, in a present invention MOSFET, Drain Current vs. Applied Drain to Source Voltage curves are realized only when the Polarities of the Applied Gate to Source and Drain to Source Voltages are the opposite, and the Polarity applied between the Gate and the Source is appropriate to cause an Inverted Channel Region. Now, this means that looking from the Gate to the Source and from the Gate to the Drain, one will, by necessity, see the same Polarity Voltage from the Gate with respect to either the Drain and Source in an operating MOSFET. In the case of an N-Channel MOSFET, in operation the Gate must be of a Positive Potential with respect to the Source to form an Inverted Channel region therein. As the Voltage applied to the Drain must be of an opposite Polarity, a Negative Drain Potential with respect to the Source must be applied thereto. This necessitates that the Gate be relatively Positive with respect to both Source and Drain, but that simultaneously the Drain maintain a Negative Polarity with respect to the Source. In the case of a P-Channel MOSFET a Negative Voltage is applied to the Gate to form an Inverted P-Type Channel region therein, with respect to the Source during operation, and a Positive Polarity Voltage is applied to the Drain, again with respect to the Source. This necessitates that the Gate see a relatively Positive Potential looking into either the Drain or Source, but that the Drain remain at a relatively Positive Potential with respect to the Source. In a CMOS system these conditions can occur only where the P-Channel Device Drain is considered as connected to a Relatively Positive Source if Voltage with respect to the Drain of the N-Channel MOSFET, and the Sources of said N and P-Channel MOSFETS are electrically interconnected to one another. Prior to applying Gate Voltage to such a CMOS system the electrically interconnected Sources will necessarily be at a Voltage between those Voltages Applied between the respective P and N-Channel MOSFET Drains. When the electrically interconnected Gates are caused to be at a relatively negative Voltage, (ie. near that applied to the N-Channel MOSFET Drain), both the Drain and Source of the P-Channel MOSFET will be relatively Positive, (ie. near that applied to the Drain of the P-Channel MOSFET), with the Source thereof remaining at a somewhat relatively less positive level with respect to the Drain thereof. This is because a Negative Gate to Source Voltage causes the P-Channel MOSFET to be turned on, (ie. become conducting because of formation of an Inverted Channel region therein). As the P-Channel MOSFET turns on, the Source Potential will become more and more Positive, thereby causing a more and more Inverted P-Channel to form. The N-Channel MOSFET, on the other hand, will be off, (ie. not conducting), because a relatively negative Gate to Source Voltage between its Gate and Source, (which will be near the relatively negative Voltage applied to the P-Channel MOSFET), can not serve to form an N-Channel Region, but rather will accumulate the Channel Region. The present invention MOSFETS have not been observed to operate with an Accumulated Channel Region. When the Gates of the N and P-Channel MOSFETS are caused to switch to a relatively Positive value, (ie. the Voltage applied to the Drain of the P-Channel MOSFET), then the N-Channel MOSFET will, conduct, (ie. an Inverted Channel Region will form therein). Both the Drain and Source thereof will be at a relatively Negative Voltage with respect to, said Gates, with the Drain remaining relatively Negative with respect to said N-Channel Source. The P-Channel MOSFET will remain off (ie. nonconducting), as a Positive Gate to Source Voltage will not effect a conducting Inverted P-Channel Region therein. Now, as alluded to above, it will be appreciated that the switching action described is "Regenerative". That is, the more "on" a MOSFET becomes, the more "on" it will strive to become as the Gate to Source, Inverted Channel Region forming, Voltage difference from the Gate to the Source increases as the switching occurs. This is because it is the Sources of the present invention MOSFETS which are electrically interconnected, and it is the voltage thereat which changes during a switch. For instance, when the Gates of the P and N-Channel MOSFETS are caused to assume a relatively positive Voltage, the Sources of both the P and N-Channel MOSFETS will switch to a continuously more Negative Voltage near that applied to the N-Channel MOSFET Drain. The further the switching action progresses, the more the "on" MOSFET Channel Region will Invert, and more inverted the "on" MOSFET Channel Region becomes the further the switching action will progress, and so on until the switching is completed. (Note that positive "feedback" is effected between Channel Inversion and Source Voltage). When the Gates of the P and N-Channel MOSFETS are caused to assume a relatively Negative Voltage, the Sources of both the P and N-Channel MOSFETS will again, regeneratively switch to a relatively more and more Positive Voltage, near that applied to the P-Channel MOSFET Drain. It is also to be appreciated that the regenerative switching does not lead to a "Latched" end point as in typical diffused junction based thyristor, (e.g. SCR's & Triacs).

A Balanced Differential Pair Metal Oxide Semiconductor Field Effect Transistor System can also be formed which comprises a first N-Channel Schottky barrier MOSFET and a second N-Channel Schottky barrier MOSFET, which first and second N-Channel Schottky barrier MOSFETS each comprise two Schottky barrier junctions, termed Source and Drain Schottky barrier junctions, which Source and Drain Schottky barrier Junctions in said first and second N-Channel Schottky barrier MOSFETS are respectively separated by first and second P-type Semiconductor Channel regions. In said first and second N-Channel Schottky barrier MOSFETS first and second Gates are offset from said first and second P-type Semiconductor Channel Regions respectively by first and second regions of insulator material. Said Source Schottky barrier junctions of said first and second N-Channel Schottky barrier MOSFETS are electrically interconnected to one another such that during use Drain Schottky barrier junction Current vs. Applied Drain Schottky barrier junction to Source Schottky barrier junction Voltage as a function of Applied Gate Voltage Operating Curves appear only in each N-Channel Schottky barrier MOSFET when the Voltage applied to the Drain Schottky barrier junction thereof is of a Negative Polarity, and when the Voltage applied to the Gate is of a Positive Polarity so as to induce an inverted N-Type Channel Region, both said applied Drain Schottky barrier junction and Gate Voltages being referenced to the Source Schottky barrier junction as a common terminal. In use Negative Polarity Voltage is applied to each of the electrically noninterconnected Drain Schottky barrier Junctions of the two N-Channel Schottky barrier MOSFETS, said applied Negative Polarity being with respect to the Voltage applied to the electrically interconnected Source Schottky barrier junctions of said first and second N-Channel Schottky barrier MOSFETS. A Voltage is applied between the Gates of said first and second N-Channel MOSFETS, with the effect being that current flow through each of the N-Channel MOSFET Drain Schottky barrier junctions is controlled in a complementary manner by said applied Voltage between said Gates of said first and second N-Channel MOSFETS. Said Balanced Differential Pair Metal Oxide Semiconductor Field Effect Transistor MOSFET System can be firmed wherein the Semiconductor is Silicon and the Source and Drain Schottky barrier Junctions in both N-Channel Schottky barrier MOSFETS are formed between said Silicon and at least one member of the group consisting of Chromium and Chromium Disilicide.

As well a Balanced Differential Pair Metal Oxide Semiconductor Field Effect Transistor System can be formed which comprises a first P-Channel Schottky barrier MOSFET and a second P-Channel Schottky barrier MOSFET, which first and second P-Channel Schottky barrier MOSFETS each comprise two Schottky barrier junctions, termed Source and Drain Schottky barrier junctions, which Source and Drain Schottky barrier Junctions in said first and second P-Channel Schottky barrier MOSFETS are respectively separated by first and second N-type Semiconductor Channel regions. Said first and second P-Channel Schottky barrier MOSFETS first and second Gates are offset from said first and second N-type Semiconductor Channel Regions respectively by first and second regions of insulator material. Said Source Schottky barrier junctions of said first and second P-Channel Schottky barrier MOSFETS are electrically interconnected to one another such that during use Drain Schottky barrier junction Current vs. Applied Drain Schottky barrier junction to Source Schottky barrier junction Voltage as a function of Applied Gate Voltage Operating Curves appear only in each P-Channel Schottky barrier MOSFET when the Voltage applied to the Drain Schottky barrier junction thereof is of a Positive Polarity, and when the Voltage applied to the Gate is of a Negative Polarity so as to induce an inverted P-type Channel Region, both said applied Drain Schottky barrier junction and Gate Voltages being referenced to the Source Schottky barrier junction as a common terminal. In use Positive Polarity Voltage is applied to each of the electrically noninterconnected Drain Schottky barrier Junctions if the two P-Channel Schottky barrier MOSFETS, said applied Positive Polarity being with respect to the Voltage applied to the electrically interconnected Source Schottky barrier junctions of said first and second P-Channel Schottky barrier MOSFETS. In use a Voltage is applied between the Gates of said first and second P-Channel MOSFETS, the effect is that current flow through each of the P-Channel MOSFET Drain Schottky barrier junctions is controlled in a complementary manner by said applied Voltage between said Gates of said first and second P-Channel MOSFETS. Said Balanced Differential Pair Metal Oxide Semiconductor Field Effect Transistor MOSFET System can be realized where the Semiconductor is Silicon and the Source and Drain Schottky barrier Junctions in both P-Channel Schottky barrier MOSFETS are formed between said Silicon and at least one member of the group consisting of Chromium and Chromium Disilicide.

It is to be noted that both P and N-Channel Balanced Differential Pair Metal Oxide Semiconductor Field Effect Transistor MOSFET System as described above can be formed on a single substrate, just as is the case with present invention CMOS systems.

The present invention will be better understood by reference to the Detailed Description Section of this Disclosure in conjunction with the accompanying Drawings.

SUMMARY OF THE INVENTION

Metal Oxide Semiconductor Field Effect Transistors (MOSFETS) are well known. Conventional fabrication thereof utilizes diffused junction technology to create required rectifying junctions at the ends of channel regions therein, and require a relatively large number of fabrication steps. As each step in a fabrication procedure introduces defects to devices being fabricated, a process for fabricating MOSFET devices which requires a reduced number of fabrication steps would be of utility. An alternative to diffused junction technology for creating rectifying junctions is Schottky barrier junction technology. The present invention teaches that Schottky junction technology can be successfully applied to fabrication of rectifying junctions suitable for use in MOSFETS. In addition, the present invention demonstrates that said Schottky barrier junction technology is applicable to simultaneous fabrication of MOSFETs on both N and P-type silicon when Chromium is deposited thereupon and annealed thereto. The present invention thus teaches and demonstrates that Schottky barrier junction technology is applicable to the fabrication of Complimentary Metal Oxide Semiconductor Field Effect Transistor (CMOSTS) device systems. The present invention also teaches that where Chromium is used to form a Schottky barrier in a Schottky barrier MOSFET, that a MOSFET with previously unreported Operating Characteristics results, and that such leads to formation of a CMOS System which, in use, demonstrates Regenerative Switching. In such a Regenerative Switching CMOS System it is noted that it is the N and P-Channel MOSFET Sources are electrically connected to one another to form a midpoint. (In conventional CMOS and in reported Schottky barrier CMOS Systems it is the Drains of N and P-Channel Devices which are electrically interconnected). The Operating Characteristics of actually fabricated present invention N and P-Channel MOSFETS are that Drain Current vs. Applied Drain-to-Source Voltage may occur when the Voltage Polarities Applied to the gate and the Drain are opposite, (as referenced to the Source), and the Voltage Polarity Applied to the gate is appropriate to cause formation of an Inverted Channel Region. In previously known reported CMOS Systems, Drain Current Curves occur when the Gate and Drain Voltage Polarities are the same, (as referenced to the Source).

The present invention teaches that use of present invention N and P-Channel MOSFETS in a CMOS System, wherein the Sources of said N and P-Channel MOSFETS are electrically interconnected, (rather than the Drains as in conventional Diffused Junction and previously reported Schottky barrier MOSFETS), a fast switching CMOS System results because no minority carriers are involved to slow operation, and because switching is Regenerative.

The present invention also teaches MOSFET devices systems comprised of MOSFETS as described above, but in which two MOSFET devices formed on N-type silicon, or two MOSFET devices formed on P-type silicon have the source of one MOSFET device electrically connected to the drain of the other, or have the sources of MOSFET devices electrically connected together. Said device system configurations being seriesed MOSFETS, or balanced differential MOSFET systems. As well, the present invention teaches single device equivalents to CMOS.

It is therefore a primary purpose of the present invention to teach a CMOS device system comprising two metal-N-type and/or metal-silicide-N-type semiconductor rectifying junctions separated by a first channel region, in functional combination with two metal-P-type and/or metal-silicide-P-type semiconductor rectifying junctions separated by a second channel region, said rectifying junctions separated by a second channel region, said first and second channel regions having first and second gates offset therefrom by first and second regions of insulating material, which CMOS device system demonstrates regenerative switching in use.

It is another a purpose of the present invention to teach a MOSFET device system comprising two metal-N-type and/or metal-silicide-N-type semiconductor rectifying junctions separated by a first-channel region, in functional combination with two metal-N-type and/or metal-silicide-N-type semiconductor rectifying junctions separated by a second channel region, said first and second channel regions having first and second gates offset therefrom by first and second regions of insulating material.

It is yet another a purpose of the present invention to teach a MOSFET device system comprising two metal-P-type and/or metal-silicide-P-type semiconductor rectifying junctions separated by a first channel region, in functional combination with two metal-P-type and/or metal-silicide-P-type semiconductor rectifying junctions separated by a second channel region, said first and second channel regions having first and second gates offset therefrom by first and second regions of insulating material.

It is another purpose yet of the present invention to teach a Balanced Differential MOSFET device system comprising two metal-N-type (metal-P-Type) and/or metal-silicide-N-type (metal-silicide-P-Type) semi conductor rectifying junctions separated by a first channel region, in functional combination with two additional metal-N-type (metal-P-Type) and/or metal-silicide-N-type (metal-silicide-P-Type) semiconductor rectifying junctions separated by a second channel region, said first and second channel regions, having first and second gates offset therefrom by first and second regions of insulating material.

It is a still yet another purpose of the present invention to teach a suitable device self-delineating fabrication procedure for MOSFET device systems utilizing Schottky barriers, which fabrication procedure can simultaneously allow fabrication of both n and P-Channel MOSFETS, and requires a lessor number of defect introducing fabrication steps as compared to fabrication schemes utilizing diffused junction technology.

It is a further purpose of the present invention to disclose experimentally obtained results which demonstrate operational characteristics of Schottky barrier technology derived MOSFET devices fabricated by the disclosed fabrication procedure in which chromium was used as a Schottky barrier forming metal.

BRIEF DESCRIPTION OF THE DRAWINGS

FIG. 1b shows a side cross-sectional view of a conventional MOSFET taken at a—a in FIG. 1a.

FIG. 2b shows a side cross-sectional view of a conventional CMOS device system taken at b—b in FIG. 2a.

DETAILED DESCRIPTION

Figure 1A:
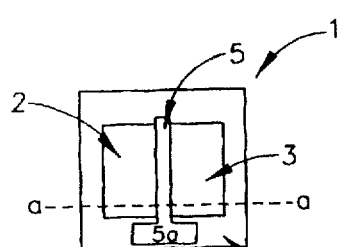
FIG. 1a shows a top view of a conventional MOSFET.
Figure 2A:
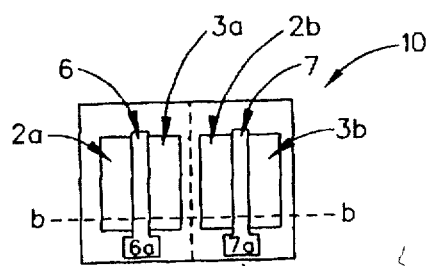
FIG. 2a shows a top view of a conventional CMOS device system.
Figure 1B:
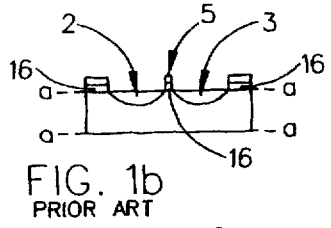
Figure 2B:
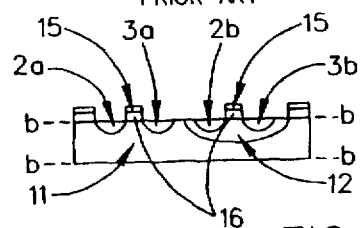

Turning now to the Drawings, there is shown in FIGS. 1a and 1b a conventional diffused junction silicon substrate MOSFET (1). Shown are a silicon substrate (4) of N or P-type doping with oppositely doped diffused source (2) and drain (3) regions present therein. Shown as well are gate (5) and gate pad (5a), with silicon dioxide (16) present between said gate (5) and a channel region thereunder between said source (2) and drain (3). FIG. 2 shows a CMOS device system (10) comprising a substrate with regions of N (11) and P-type (12) doping. Diffused source (2a) and (3b) and diffused drain (3a) and (2b) regions, of opposite type doping with respect to the type of substrate respectively with which they are associated, are shown on each of the N (11) and P-type (12) regions. Also shown are gates (6) and (7) and gate pads (6a) and (7a). During use gates (6) and (7) can be electrically connected, and drain (3a) can be electrically connected to drain (2b). Source (2a) can be connected to an external positive voltage (Vd) and source (3b) connected to, external voltage (Vs) which is typically ground. When a relatively low gate voltage is simultaneously applied to the electrically connected gates (6) and (7) the MOSFET on the N-type silicon (11) will have an inverted P-type channel region formed between its source (2a) and drain (3a), hence will provide a reduced resistivity therebetween. The MOSFET on the P-type (12) silicon will have an accumulated channel region and will continue to demonstrate a high resistivity. (Note that the term "inversion" means that a gate induced electric field causes silicon type to reverse in a channel region and the term "accumulation" means that a gate induced electric field causes a silicon type to become more so said type, (e.g. N or P-type) in a channel region). The voltage applied to the source (2a) will therefore appear at the electrical connection between drain (3a) and drain (2b). It should be appreciated that application of a relatively high gate voltage, (e.g. approximately Vd), will cause the voltage applied to the source (3b) to appear at the electrical connection point between drain (3a) and drain (2b). That is, a low resistivity inverted channel will form in the P-type (12) silicon device while the device on the N-type (11) silicon will demonstrate accumulated channel high drain (3a) to source (2a) resistivity. As the gate oxide is of a high resistance, (e.g. ten-to-the-forteenth ohms), little gate current is required to switch the identified voltage at the electrical connection between drain (3a) and drain (2b). Also, as one of the devices is nearly always off during operation, except momentarily at the point of switching, very little source (2a) to source (3b) current flows. It should then be appreciated that the CMOS device system is very energy efficient.

Figure 3:
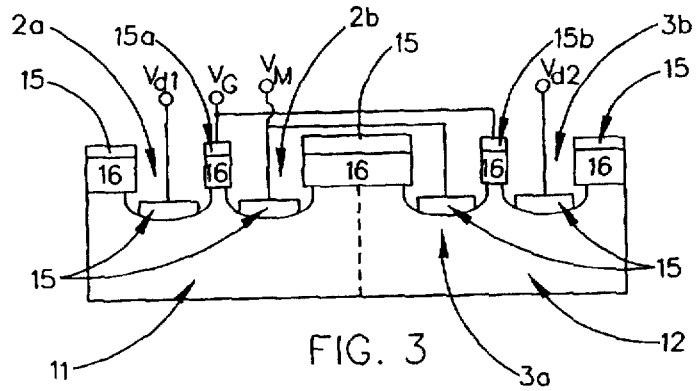
FIG. 3 shows a side cross-sectional view of a Schottky barrier MOSFET device system which is representative of the present invention.
Figure 5:
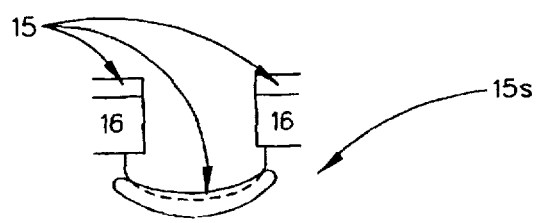
FIG. 5 demonstrates the formation of a metal-silicide when a metal which has been deposited upon a semiconductor substrate is annealed.
Figure 6A:
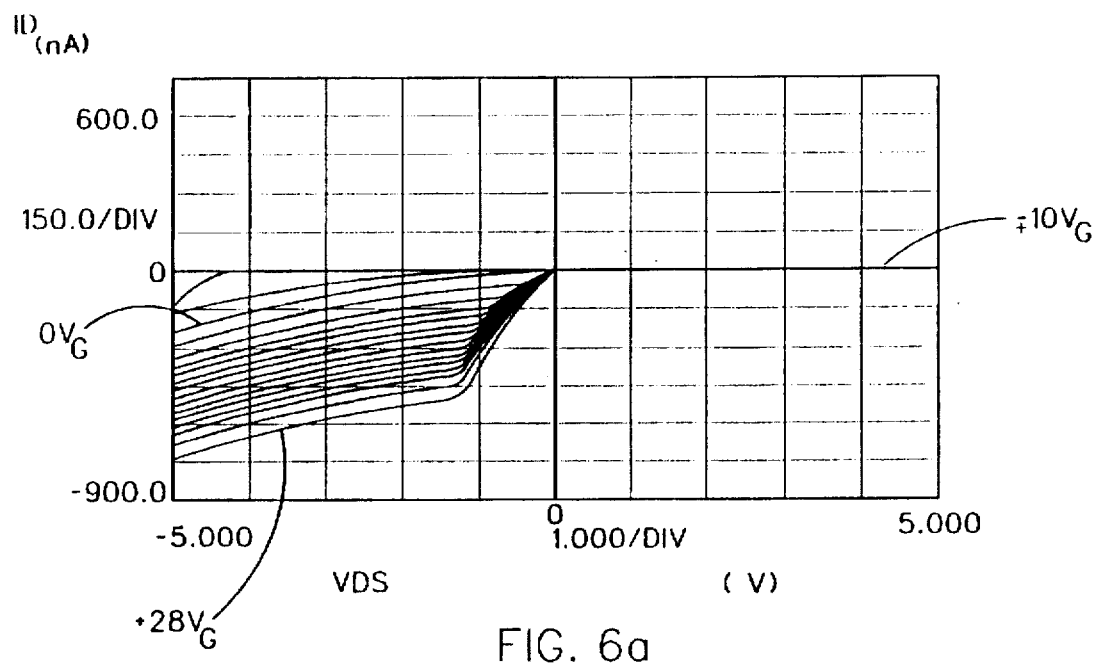
FIGS. 6a & 6b show MOSFET drain-current vs. drain-to-source voltage curves, as a function of gate-to-source voltage, provided by devices formed on P-type silicon wherein chromium was deposited in drain and source regions and annealed thereto.
Figure 7A:
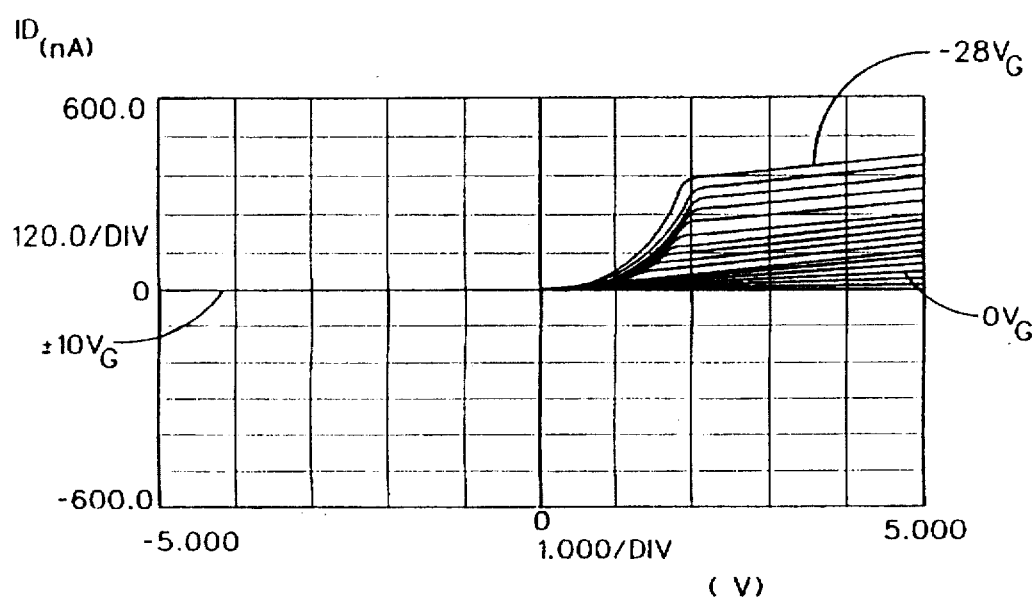
FIGS. 7a & 7b show MOSFET drain-current vs. drain-to-source voltage curves, as a function of gate-to-source voltage, provided by devices formed on N-type silicon wherein chromium was deposited in drain and source regions and annealed thereto.
Figure 6B:
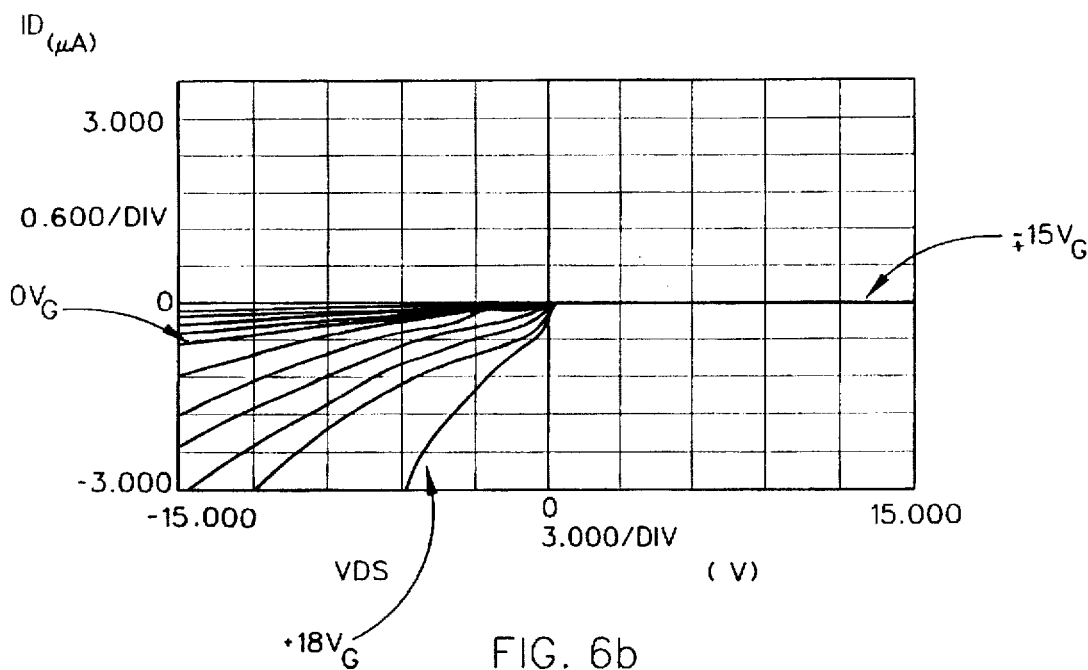
Figure 7B:
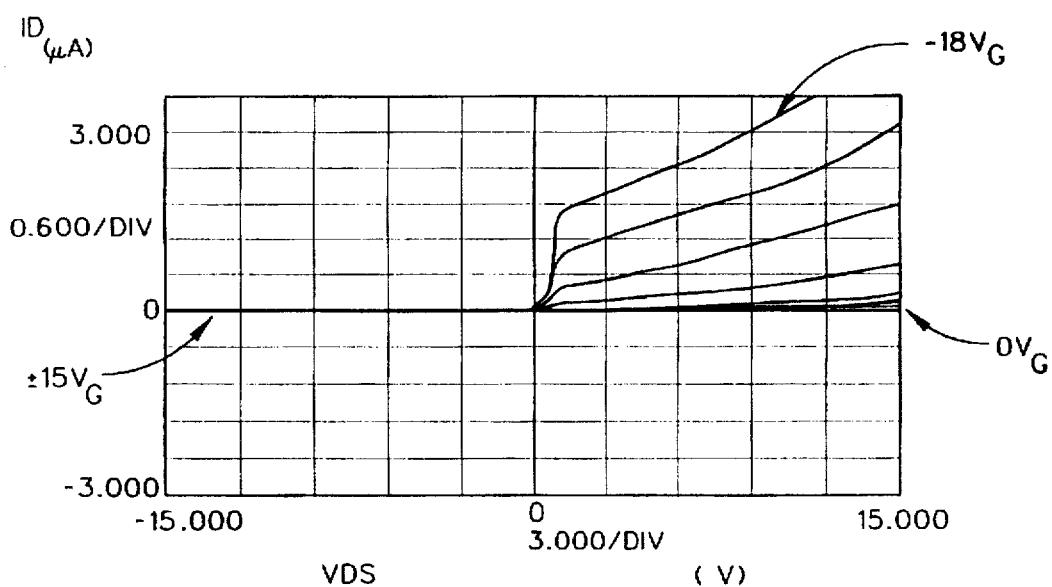

Turning now to FIG. 3, there is demonstrated a structure of a CMOS device of the present invention. Both N (11) and P-type (12) doped regions are shown in a silicon substrate. Shown also are silicon dioxide (16), gates (15a) and (15b), sources (2b) and (3a) and drains (2a) and (3b) with metal (15) present, said metal (15) being discontinuous between that atop the silicon dioxide (16) and atop the N-type (11) and P-type (12) silicon. The gates (15a) and (15b) are offset from respective Channel Regions by first and second regions of insulating material, and are shown to be electrically connected, as are P-Channel Source (2b) and N-Channel Source (3a). FIG. 5 demonstrates that an anneal of metal (15) in contact with silicon can cause formation of a silicide (15s) at the metal-silicon interface or otherwise effects a Schottky barrier rectifying junction, between said metal (15) and said silicon. This is the case whether the silicon is N (11) or P-type (12), and resulting rectifying junctions formed on N or P-Type Silicon are comparable in quality.

Figure 4:
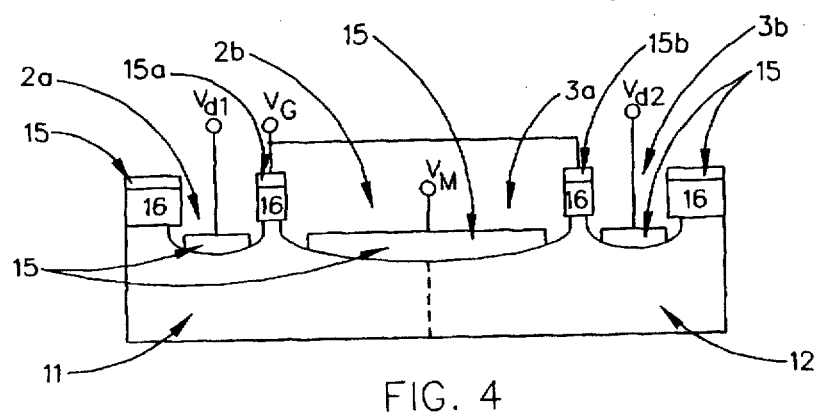
FIG. 4 shows a side cross-sectional view of a modified Schottky barrier MOSFET device system which is representative of the present invention.

It should be appreciated that deposition of metal (15) upon a substrate etched as demonstrated in FIG. 3 can provide a self delineated CMOS device system, although self delineation fabrication is not a requirement of the present invention. FIG. 4 shows a variation in which the oxide is removed between P and N-Channel MOSFET Source (2b) and Source (3a) respectively. It is noted that the P and N-Channel MOSFET Sources (2b) and (3a) and Drains (2a) and (3b) regions in FIGS. 3 and 4 are shown etched into the Silicon Regions (11) and (12). It is to be understood that this is demonstrative rather than essential to the practice of the present invention.

It is important to note that the Drain-Current vs. Drain-to-Source-Voltage Operational Curves of present invention MOSFETS, (see FIGS. 6a, 6b, 7a & 7b), are unlike those of Diffused Junction MOSFETS, or reported Schottky barrier MOSFETS. That is, significant Drain Current (ID), (as a function of applied Gate Voltage), flow occurs only when the polarity of the applied voltages, ((VGS) and (VDS) respectively), applied between a gate (e.g. 15a or 15b) and a Source (e.g. 2b or 3a respectively), and that between a Drain (e.g. 2a or 3b respectively) and Source, (e.g. 2b or 3a respectively) are simultaneously of opposite polarities, and where the polarity of the Voltage Applied to the Gate, (e.g. 15a or 15b respectively), is appropriate to effect an Inverted Channel Region in the type of Semiconductor involved.

(Note, a Positive Potential Applied Gate Voltage will effect an N-Type Inversion Channel Region in P-type Silicon and a Negative Applied Gate Voltage will effect an Inversion P-Type Channel Region in N-Type Silicon).

Reference to FIGS. 6a & 6b and 7a & 7b show that N and P-channel MOSFET devices fabricated on P and N-type silicon respectively by the inventor herein, using approximately eight-hundred (800) angstroms of chromium as the metalization, which chromium was simultaneously vacuum deposited on both N (11) and P-type (12) silicon and then simultaneously vacuum annealed to said N (11) and P-type (12) silicon at four-hundred (400) degrees centigrade for thirty (30) minutes, provide MOSFET-type operational Drain Current vs. Drain-to-Source voltage curves as a function of Gate-to-Source voltage. It is also disclosed that tested devices demonstrated by FIGS. 6a & 7a had a Gate (15a or 15b) length and width of approximately ten (10) microns and seventy-five (75) microns respectively, and that test devices demonstrated by FIGS. 6b & 7bhad a Gate length and width of approximately ten (10) microns and fifteen (15) mils respectively. It is noted that FIG. 6a and 6b Drain Current (ID) vs. Drain-to-Source Voltage (VDS) curves for MOSFET devices, (as a function of gate-to-source volts (VG)), fabricated on P-type silicon (12) (ie. N-Channel Schottky barrier MOSFETS), are in the third quadrant and the FIG. 7a and 7b Drain Current vs. Drain-to-Source Voltage curves for devices, (as a function of gate-to-source volts), fabricated on N-type (11) silicon, (ie. P-channel Schottky barrier MOSFETS), are in the first quadrant. The Drain Current flow direction is thus seen to be opposite to what would be expected by reference to the Lepselter et al. article referenced in the Background Section of this Disclosure regarding Schottky barrier MOSFETS, and opposite to that which occurs in Diffused Junction MOSFETS. That is, the present devices operate with the Drain junction in each device reverse biased rather than the Source junction, as was reported by Lepselter and Sze regarding the Schottky barrier MOSFETS they fabricated. At this time the mechanism of operation of the present invention MOSFETS represented by FIGS. 6a & 6b and 7a & 7b is not fully understood, however it is believed that modulation of Reverse Bias Leakage Current through the Reverse Biased Drain Schottky barrier junction, as a result of applied Gate Voltage Modulated Semiconductor Doping, serves as an explanation as to what is occurring. This explanation is consistent with the well known fact that Schottky barrier junctions formed on more highly doped Silicon demonstrate a larger Reverse Bias Leakage Current than those formed on less highly doped Silicon and the known fact that application of a Gate Voltage in a MOSFET serves to modulate Effective Channel Region Doping. It is also noted and emphasized that the Drain-Current vs. Drain-to-Source Voltage Curves in FIGS. 6a & 6b and 7a & 7b are quite Complementary and nearly symetrical with respect to one another. These attributes make the devices which provided said Drain-Current vs. Drain-to-Source Voltage Curves quite appropriate for application in combined CMOS device systems. It is also noted that devices formed on both N (11) and P-type (12) silicon show a small drain current with zero (0.0) Gate-to-Source volts applied. Application of gate voltages of opposite polarities serve to reduce said Drain Currents to essentially zero in the respective MOSFET devices formed on N and P-type silicon respectively, however, making said devices initially depletion mode in nature. It is believed that partial Channel Region Inversion effected by applied Gate and Drain Voltages, or Gate Oxide Leakage Currents account for this effect. It is also expressly pointed out that no Drain Current flow was detected in fabricated N or P-Channel MOSFETS when the Gate (15a or 15b) Voltage was of a polarity not appropriate to cause Channel Region Inversion, or when the same Polarity Voltage was applied from a Gate to Source and from a Drain to Source. That is, in fabricated N and P-Channel MOSFETS, Drain Current Curves were obtained only when the Applied Gate Voltage Polarity was appropriate to Invert a Channel Region, and when the Applied Drain to Source Voltage was of an Opposite Polarity to that Applied between said Gate to Source. This MOSFET Operational scenario is believed by the Inventor to be surprising and previously unreported. It is also believed that formation of a "Pinch-off" region in a Channel Region of a present invention Schottky barrier N or P-Channel MOSFET, when the Polarities of the Voltages applied to the Drain and Gate thereof are the same, serves to "shelter" the then Reverse-Biased Source Junction, and that insufficient Voltage Drop thereacross in use prevents the forcing of Reverse Bias Leakage Current therethrough. That is, the Pinch-off regions absorbs all applied Voltage. This, of course, does not occur where opposite polarity voltages are applied to the Gate and Drain of a MOSFET. In that case essentially all applied Voltage between a Drain and Source will drop across the reverse biased Drain, with the Source being forward biased. No Pinch-off Region will be present to absorb any of the applied Drain to Source Voltage. In contrast, it is noted that in conventional Diffused Junction MOSFETS the Pinch-off Region is responsible for causing Drain Current Saturation. That is, Operational Drain Current Curves are achieved when a Pinch-off Region is present. It is also noted that the Schottky barrier MOSFETS reported by Koeneke et al. and by Legselter and Sze, referenced in the Background Section of this Disclosure, operate when a "Pinch-off" Region is present, (ie. when the same polarity voltages are applied to the Gate and Drain of their Schottky barrier MOSFETS), much as do conventional Diffused Junction MOSFETS. This is proven by the statement in the Koeneke et al. patent to the effect that their reported Schottky barrier MOSFETS can replace conventional Diffused Junction MOSFETS in a circuit, and provide protection against Latch-up of a CMOS circuit when such is done. This point is emphasized to draw attention to the surprising nature of the operating characteristics of the present invention Schottky barrier MOSFETS, which Operating Characteristics make them suitable for use in forming a CMOS system which demonstrates Regenerative switching. No other known MOSFET provides Operating Characteristics which could effect Regenerative Switching in a CMOS System, emphasis added.

Figure 8:
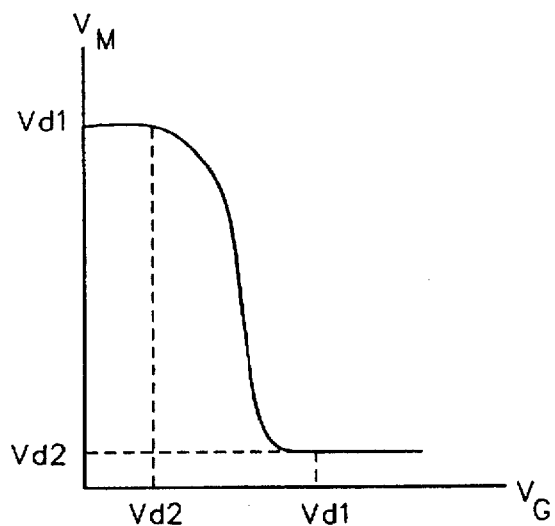
FIG. 8 demonstrates CMOS switching curves, such as provided by a seriesed combination of present invention N-Channel and P-Channel MOSFETS which provide Drain-Current vs. Drain-to-Source Voltage Curves as demonstrated in FIGS. 6a & 6b and 7a & 7b respectively. Note that the Curves are shown extended over the VG axis to demonstrate that increasing VG causes an inverting effect on VM. An actual switching Curve will be abrupt because of the regenerative nature of a switch.

Continuing, electrically inter connecting P-Channel, MOSFET Source (2b) and N-Channel MOSFET Source (3a) as described above to form a CMOS device system, and sequentially, but simultaneously, varying values of Gate-to-Source voltage to electrically interconnected Gates (15a) and (15b) provides CMOS device system Regenerative Switching Operational Curves such as qualitatively shown in FIG. 8.

FIG. 8 shows that the voltage (Vm) (ie. voltage present at the electrically interconnected point of P-Channel MOSFET Source (2b) and N-Channel MOSFET Source (3a), switches between, essentially that applied to Drain (2a) (ie. Vd1) and that applied to Drain (3b) (ie. Vd2) by external circuitry, when the Gate Voltage Applied simultaneously to P and N-Channel MOSFET Gates (15a) and (15b) is simultaneously varied between that applied to N-Channel MOSFET Drain (3b) (Vd2) and P-Channel MOSFET Drain (2a) (ie. Vd1). That is, a Voltage Inverting Switch occurs. It is noted that the nature of said inverting switch is "Regenerative", as discussed in the Disclosure of the Invention Section of this Disclosure. With reference to FIGS. 3, 4, 8 and 9 however, it is again noted that the Sources (2b) & (3a) of the present invention Schottky barrier P and N-Channel MOSFETS are electrically interconnected to one another as are the Gates (15a) & (15b) thereof electrically interconnected to one another, to form a Regeneratively switching CMOS System. The Drain (2a) of the P-Channel MOSFET is then caused to be connected to a Positive Voltage (+Vd1) with respect to the Voltage (Vd2) applied to the Drain (3b) of the N-Channel MOSFET. Then, as shown in FIG. 8, wherein the electrically interconnected Gates (15a) & (15b) have applied thereto the relatively higher Voltage (+Vd1) applied to the Drain (2a) of the P-Channel MOSFET, the Voltage (VM) at the electrically interconnected P and N-Channel MOSFET Sources (2b) & (3a) is caused to Regeneratively switch (ie. invert), to essentially the lower Voltage (Vd2) applied to the Drain (3b) of the N-Channel MOSFET. When the Voltage applied to the electrically interconnected MOSFET Gates (15a) & (15b) is caused to be set to lower Voltage (Vd2), (e.g. lower with respect to that applied to the Drain (2a) of the P-Channel MOSFET), applied to the N-Channel MOSFET Drain (3b), the Voltage (VM) Regeneratively switches (ie. inverts) to essentially the relatively higher Voltage (Vd1) applied to the Drain (2a) of the P-Channel MOSFET. The reason the switching is Regenerative is that each MOSFET is turned "on" by applying Voltage between the Gate and Source thereof. In the present invention CMOS system, the Voltage at the electrically interconnected Sources changes during a switch, to a value which further encourages the switching in the MOSFET which is turning "on", and the more "on" a MOSFET becomes the further the Source Voltage moves in a direction which encourages greater Channel Inversion to take place. It is also noted that the Voltage (VM) which presents at the electrically interconnected Sources of the P and N-Channel MOSFETS of the present invention results from a voltage division between the effective resistances presented by the P and N-Channel MOSFETS. It is readily observable that said resistance provided by an "off" MOSFET is much greater than that provided by an "on" MOSFET, by referral to FIGS. 6 and 7. Essentially no current flow was observed in "off" MOSFETS.

Figure 9:
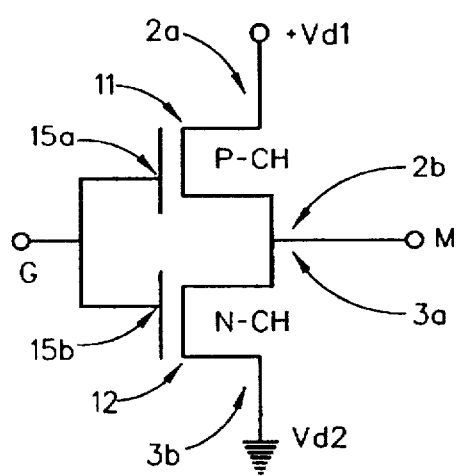
FIG. 9 shows a schematic diagram of a Regenerative Switching CMOS System of the present invention, in which the Sources of shown N and P-Channel MOSFETS are electrically interconnected.

FIG. 9 shows a schematic diagram of a Regenerative CMOS Switching System of the present invention. Shown are electrically interconnected P-Channel and N-Channel MOSFET Gates (15a) and (15b) respectively, (which form a common Gate (G)), electrically interconnected P and N-Channel MOSFET Sources (2b) and (3a) respectively, (forming Midpoint (M)), and electrically noninterconnected P and N-Channel Drains (2a) and (3b) respectively with Applied Voltages VD1 and VD2 applied thereto respectively, where Vd1 is indicated as being positive with respect to Vd2. Also indicated are the presence of N-Type (11) and P-Type (12) Silicon in the P-Channel and N-Channel MOSFETS respectively.

Figure 10:
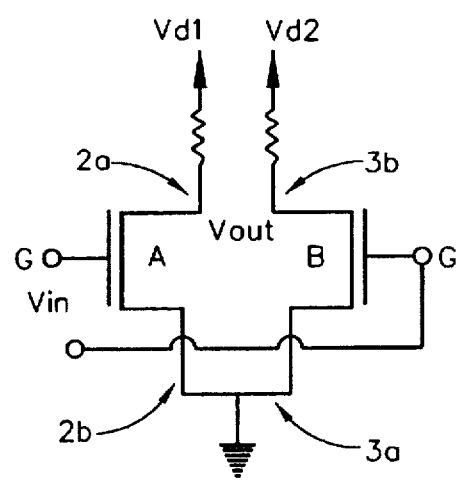
FIG. 10 shows a schematic diagram if a MOSFET Differential Pair System of present invention. The MOSFETS can be either both N-Channel or both P-Channel.

It is also noted that it is possible to form Balanced Differential Pair MOSFET transistor systems by electrically interconnecting sources of two MOSFETS devices. The present invention should be considered to include such configurations as the distinction therein is the type of silicon upon which two simultaneously fabricated electrically connected devices are formed. That is, instead of electrically connecting MOSFET devices formed on N and P-type silicon, two devices formed on N-type, or two devices formed on P-type, silicon are electrically connected. Preferring to FIGS. 3 and 4, this would correspond to interpreting both semiconductor regions (11) and (12) to be of one type, (ie. N or P-type) along with considering the shown common gate electrical connection as broken. FIG. 10 shows a schematic diagram of such a Balanced Differential Pair of MOSFETS of the present invention. Note that Sources (2b) and (3a) are shown electrically interconnected. Voltages (Vd1) and (Vd2) are shown applied, via resistors to Drains (2a) and (3b) respectively. In use an Input Voltage applied between the Gates provides an output Voltage between the Drains (2a) and (3b). Both MOSFETS "A" and "B" in said Balanced Differential Pair are of one Channel-Type, (ie. both N-Channel or both P-Channel), but can be of either Channel-Type. In use application of voltage to the Gates.

A simple seriesed MOSFET configuration can be realized by electrically connecting a rectifying junction drain (2b) of one MOSFET to a rectifying junction source (3a) of another.

If semiconductor regions (11) and (12) in FIG. 4 are considered to be of the same doping type, (ie. N or P), and metal (15) in regions (2a) and (3b), or equivalent silicide etc., provides rectifying junctions on said semiconductor (11) and (12), then applying gate volts (Vg) simultaneously to gates (15a) and (15b) can effect a single substrate type, (ie. single device), equivalent to CMOS. For instance, if semiconductor regions (11) and (12) are both N-type and a positive value of (Vd2) is applied to the rectifying junction at (3b) while a less positive voltage (Vd1) is applied to rectifying junction (2a) then said applied voltages (Vd2) and (Vd1) will cause the rectifying junction at (3b) to be forward biased and the rectifying junction at (2a) to be reverse biased. Application of a negative gate voltage to gates (15a) and (15b) just sufficient to cause onset of inverted channel regions thereunder in the semiconductor, in effect causes the rectifying junction at (3b) to become reverse biased and the rectifying junction at (2a) to become forward biased at said channel regions. That is, the reverse and forward biased rectifying junction positions are switched. It will be appreciated that if said forward biased rectifying junctions are not required or allowed to carry much current flow, which is effected by limiting the magnitude of the applied gate voltage and external loading connected at (2b) and (3a), the end effect will be to cause the voltage (Vm), as identified in FIG. 4, to shift between (Vd1) and (Vd2). It is pointed out that it is preferrable to effect an essentially ohmic contact for sensing (Vm) at (2b) and (3a). That is, the use of a different metal and/or silicide might be preferable in semiconductor regions (2b) and (3a) as compared to that utilized in semiconductor regions (2a) and (3b), said different metal and/or silicide serving to form ohmic rather than rectifying junctions with the semiconductor substrate at (2b) and (3a). The Semiconductor substrate (11) and (12) can also, or in the alternative, be caused to be of an increased doping level at (2b) and (3a) by diffusion or ion implantation for instance, so as to cause an effectively ohmic Schottky barrier junction at (2b) and (3a) using the same metal and/or silicide that forms Schottky barrier rectifying junctions at (2a) and (3b). (Note that metal-semiconductor and metal-silicide-semiconductor junctions wherein the semiconductor is relatively highly doped, (e.g. ten-to-the eighteenth and higher), often demonstrate essentially ohmic current-voltage characteristics). It will be appreciated that an equivalent single device CMOS system can also be effected on P-type semiconductor, wherein opposite polarity applied voltages (Vd1), (Vd2) and (Vg) are utilized It is to be understood that the terminology "Applied Drain and Source Voltages", as used in this Disclosure refer to voltages applied to a metal side of Schottky barrier junctions.

It is also noted that the Source and Drain junctions of a Schottky barrier MOSFET are physically typically indistinguishable from one another. That is, it is location in a circuit, and Applied Voltages which serve to identify a Source and Drain in an operating circuit. The Source being a Common Terminal with respect to which Gate and Drain Voltages are applied. This being the case, in the Claims the terminology "electrically interconnected" and "electrically noninterconnected" are utilized to describe, for instance, "Schottky barrier Drains" and "Schottky barrier Sources" in a Regenerative Switching CMOS configuration. Said functional based language is equivalent to stating that in a Regenerative Switching CMOS System of the present invention, it is the Sources which are electrically interconnected and the Drains which are left free to be connected to Voltage Sources.

Finally, it is felt that the combination if N and P-Channel hot-carrier Schottky barrier junction MOSFETS to form a CMOS system which demonstrates Regenerative Switching, which N and P-Channel Schottky barrier MOSFETS have been shown to be fabricatable by a common procedure, is new novel and non-obvious. No known reference suggests that MOSFETS which operate only with opposite polarity voltages applied to the Gate and Drain are achievable. No known reference suggests that Chromium annealed to N or P-Type Silicon in a simultaneous process would form such MOSFETS. Discovery thereof by the Inventor was a suprise. Next, no known reference suggests that a CMOS System can be configured by electrically interconnecting the Sources of N and P-Channel MOSFETS, with the result that Regenerative Switching is demonstrated in use. The utility provided by the present invention is found not only in the resulting CMOS Systems achieved, but also in the ease of fabrication of CMOS Systems using Schottky barrier junctions in both N and P-Channel MOSFETS. Present invention CMOS systems, because of the use of hot-carrier Schottky barrier junctions, (rather than diffused junctions which involve switching speed reducing minority carriers), in both N and P-Channel MOSFET Source and Drain Regions, and because of the Regenerative nature of the switching provided thereby, (as dictated by the operational characteristics of both N and P-Channel Schottky barrier MOSFETS actually fabricated using Chromium as the Schottky barrier forming metal), can provide extremely fast, high frequency operational devices. It is also to be understood that the terms "operate" and "operational" are to be understood to mean that significant Drain Current modulation occurs when applied Gate Voltage is changed in a polarity direction which serves to invert a Channel Region in the presence of an opposite Polarity applied Drain Voltage, as represented by the third quadrant of FIGS. 6a & 6b and the first quadrant in FIGS. 7a & 7b. It is to be understood that while some relatively small currents may flow in other Polarity combination representing quadrants of said Figures, said other quadrants represent non-operational modes of applied Voltage Polarities.

For clarity, it is to be noted that the Claims recite Drain and Source, when refering to Drain current and applied Drain to Source voltage. In the body of the Specification the terminology Drain Junction and Source Junction was, at times, utilized. It is to be understood that for the purposes of this Specification, Drain current is to be considered equivalent to Drain Junction current, and that Voltage applied between Drain and Source Junctions is to be considered equivalent to voltage Applied between Drain and Source. Any confusion should be resolved by realizing that Drain and Source Junctions are each comprised of two components, a Semiconductor component and a non-Semiconductor component. In the Specification, Applied Drain junction to Source junction voltage (VDS), (as demonstrated in FIGS. 6a, 6b, 7a and 7b), is to be understood to always be applied between non-Semiconductor Drain and non-Semiconductor Source components, and Drain junction current (ID), (as demonstrated in FIGS. 6a, 6b, 7a and 7b as a function of Gate voltage (VG)), is to be understood as always accessed at the non-Semiconductor component of a Drain junction.

Having hereby disclosed the subject matter of the present invention, it should be obvious that many modifications, substitutions, and variations of the present invention are possible in light of the teachings. It is therefore to be understood that the present invention may be practiced other than as specifically described, and should be limited in breadth and scope only by the claims.

I claim:

1. A complementary metal oxide semiconductor (CMOS) system which demonstrates regenerative switching in use, comprising an N-channel metal oxide semiconductor field effect transistor (MOSFET) in series combination with a P-channel MOSFET; which P-channel MOSFET comprises a device formed in a surface region of an N-type semiconductor, said P-channel MOSFET comprising two junctions, termed source and drain junctions, which source and drain junctions are separated by an N-type semiconductor channel region, each of said source and drain junctions being formed from said N-type semiconductor and, respectively, source and drain forming material(s); in which P-channel MOSFET a gate is offset from said N-type semiconductor channel region by a first region of insulator material, which P-channel MOSFET provides significant drain (junction current vs. applied drain (to source voltage as a function of applied gate voltage operating curves only when the voltage applied to the drain is of a positive polarity, and when the voltage applied to the gate is of a negative polarity so as to induce an inverted P-type channel region, both said drain and gate voltages being referenced to the source as a common terminal; and which N-channel MOSFET comprises a device formed in a surface region of a P-type semiconductor, said N-Channel MOSFET comprising two junctions, termed source and drain junctions, which source and drain junctions are separated by a P-type semiconductor channel region, each of said source and drain junctions being formed from said P-type semiconductor and, respectively, source and drain forming material(s); in which N-channel MOSFET a gate is offset from said P-type semiconductor channel region by a second region of insulator material, which N-channel MOSFET provides significant drain current vs. applied drain to source voltage as a function of applied gate voltage operating curves only when the voltage applied to the drain is of a negative polarity, and when the voltage applied to the gate is of a positive polarity so as to induce an inverted N-type channel region, both said applied drain and gate voltages being referenced to the source as a common terminal; the source of said N-channel MOSFET and the source of said P-channel MOSFET being electrically interconnected to one another, and said gates of said N and P-channel MOSFETs being electrically interconnected to one another; such that when a positive polarity voltage is applied to the electrically noninterconnected drain of the P-channel MOSFET, said positive polarity being with respect to the voltage applied to the electrically noninterconnected drain of the N-channel MOSFET, and voltage at the electrically interconnected gates is set to essentially that applied to the electrically noninterconnected drain of the N-channel MOSFET, the voltage at the electrically interconnected sources of the N and P-channel MOSFETs regeneratively switches to essentially that applied to the electrically noninterconnected drain of the P-channel MOSFET; and when the voltage at the electrically interconnected gates is set to essentially that applied to the electrically noninterconnected drain of the P-channel MOSFET, the voltage at the electrically interconnected sources of the N and P-channel MOSFETs regeneratively switches to essentially that applied to the electrically noninterconnected drain of the N-channel MOSFET.

2. A complementary metal oxide semiconductor (CMOS) system which demonstrates regenerative switching in use as in claim 1, in which the semiconductor is silicon.

3. A complementary metal oxide semiconductor (CMOS) system which demonstrates regenerative switching in use as in claim 1, in which the source and drain junctions in both the N and P-channel MOSFETs are Schottky barrier junctions.

4. A complementary metal oxide semiconductor (CMOS) system which demonstrates regenerative switching in use as in claim 1 in which the semiconductor is silicon and in which the source and drain junctions in both the N and P-channel MOSFETs are Schottky barrier junctions which are formed from said silicon and at least one source and drain non-semiconductor Schottky barrier electrode forming material(s) selected from the group consisting of chromium and chromium disilicide.

5. A complementary metal oxide semiconductor (CMOS) system which demonstrates regenerative switching in use, comprising an N-channel Schottky barrier metal oxide semiconductor field effect transistor (MOSFET) in series combination with a P-channel Schottky barrier MOSFET; which P-channel Schottky barrier MOSFET comprises a device formed in a surface region of an N-type semiconductor, said P-channel MOSFET comprising two Schottky barrier junctions, termed source and drain Schottky barrier junctions, which source and drain Schottky barrier junctions are separated by an N-type semiconductor channel region, each of said source and drain Schottky barrier junctions being formed from said N-type semiconductor and, respectively, source and drain Schottky barrier electrode material(s); in which P-channel Schottky barrier MOSFET a gate is offset from said N-type semiconductor channel region by a first region of insulator material, which P-channel Schottky barrier MOSFET provides significant drain current vs. applied drain to source voltage as a function of applied gate voltage operating curves only when the voltage applied to the drain is of a positive polarity, and when the voltage applied to the gate is of a negative polarity so as to induce an inverted P-type channel region, both said drain and gate voltages being referenced to the source as a common terminal; and which N-channel Schottky barrier MOSFET comprises a device formed in a surface region of a P-type semiconductor, said N-channel MOSFET comprising two Schottky barrier junctions, termed source and drain Schottky barrier junctions, which source and drain Schottky barrier junctions are separated by a P-type semiconductor channel region, each of said source and drain Schottky barrier junctions being formed from said P-type semiconductor and, respectively, source and drain Schottky barrier electrode materials; in which N-channel Schottky barrier MOSFET a gate is offset from said P-type semiconductor channel region by a second region of insulator material, which N-channel Schottky barrier MOSFET provides significant drain current vs. applied drain to source voltage as a function of applied ate voltage operating curves only when the voltage applied to the drain is of a negative polarity, and when the voltage applied to the gate is of a positive polarity so as to induce an inverted N-type channel region, both said applied drain and gate voltages being referenced to the source as a common terminal; the source of said N-channel Schottky barrier MOSFET and the source of said P-channel Schottky barrier MOSFET being electrically interconnected to one another, and said gates of said N and P-channel Schottky Barrier MOSFETs being electrically interconnected to one another; such that when a positive polarity voltage is applied to the electrically noninterconnected drain of the P-channel Schottky barrier MOSFET, said positive polarity being with respect to the voltage applied to the electrically noninterconnected drain of the N-channel Schottky barrier MOSFET, and voltage at the electrically interconnected gates is set to essentially that applied to the electrically noninterconnected drain of the N-channel Schottky barrier MOSFET, the voltage at the electrically interconnected sources of the N and P-channel Schottky barrier MOSFETs regeneratively switches to essentially that applied to the electrically noninterconnected drain of the P-channel Schottky barrier MOSFET; and when the voltage at the electrically interconnected gates is set to essentially that applied to the electrically noninterconnected drain of the P-channel Schottky barrier MOSFET, the voltage at the electrically interconnected Sources of the N and P-channel Schottky barrier MOSFETs regeneratively switches to essentially that applied to the electrically noninterconnected drain of the N-channel Schottky barrier MOSFET.

6. A complementary metal oxide semiconductor (CMOS) system which demonstrates regenerative switching in use as in claim 5, in which the semiconductor is silicon.

7. A complementary metal oxide semiconductor (CMOS) System which demonstrates regenerative switching in use as in claim 6, in which the source and drain Schottky barrier junctions in both the N and P-channel MOSFETs are formed from said silicon and at least one source and drain Schottky barrier electrode material selected from the group consisting of chromium and chromium disilicide.

8. A complementary metal oxide semiconductor (CMOS) system which demonstrates regenerative switching in use as in claim 5, in which the source and drain Schottky barrier Junctions in both N and P-channel Schottky barrier MOSFETs are formed in a single semiconductor substrate.

* * * * *

UNITED STATES PATENT AND TRADEMARK OFFICE
CERTIFICATE OF CORRECTION

PATENT NO. : 5,760,449
DATED : June 2, 1998
INVENTOR(S) : James D. Welch

It is certified that error appears in the above-identified patent and that said Letters Patent is hereby corrected as shown below:

Column 1, line 7 delete " +gi".

Column 24, line 33 " ( junction "should be deleted.

Column 24, line 33  delete "( " (both occurrence).

Signed and Sealed this

Fifteenth Day of September, 1998

*Attest:*

BRUCE LEHMAN

*Attesting Officer*     *Commissioner of Patents and Trademarks*